United States Patent [19]
Kim

[11] 3,943,545
[45] Mar. 9, 1976

[54] LOW INTERELECTRODE LEAKAGE STRUCTURE FOR CHARGE-COUPLED DEVICES

[75] Inventor: Choong-Ki Kim, Seoul, South Korea

[73] Assignee: Fairchild Camera and Instrument Corporation, Mountain View, Calif.

[22] Filed: May 22, 1975

[21] Appl. No.: 580,114

[52] U.S. Cl. ................................. 357/24; 357/59
[51] Int. Cl.² ..................... H01L 29/78; H01L 29/04
[58] Field of Search ............................. 357/24, 59

[56] References Cited
UNITED STATES PATENTS

| | | | |
|---|---|---|---|
| 3,728,590 | 4/1973 | Kim et al. | 357/24 |
| 3,836,409 | 9/1974 | Amelio et al. | 357/24 |

OTHER PUBLICATIONS
Radio–Electronics, Aug. 1973, pp. 56–57.

*Primary Examiner*—William D. Larkins
*Assistant Examiner*—Gene M. Munson
*Attorney, Agent, or Firm*—Alan H. MacPherson; Henry K. Woodward; J. Ronald Richbourg

[57] ABSTRACT

A charge-coupled device having a semiconductor substrate, a layer of insulation covering the substrate, and a plurality of spaced-apart electrodes formed from a doped, polycrystalline semiconductor material of a particular conductivity type includes regions of interelectrode material doped with an impurity of a conductivity type opposite to said particular conductivity type.

6 Claims, 4 Drawing Figures

ELECTRODE (SOURCE)   ADJACENT ELECTRODE (DRAIN)

LOW INTERELECTRODE LEAKAGE STRUCTURE FOR CHARGE-COUPLED DEVICES

BACKGROUND OF THE INVENTION

This invention relates to charge-coupled devices and, more particularly, relates to a structure which tends to minimize leakage between adjacent electrodes in a charge-coupled device.

For efficient transfer of carriers in charge-coupled devices, it is known that the channel potential must be controlled in the regions between adjacent gate electrodes. This control may be achieved by utilizing overlapping gate structures with two layers of conductive materials. For simplicity of fabrication, however, it is sometimes desirable to utilize nonoverlapping gate structures. For nonoverlapped gate structures, the channel potential between adjacent gate electrodes may be controlled by utilizing a resistive gate structure as disclosed in U.S. Pat. No. 3,728,590, issued to Kim et al and assigned to the same assignee as this application, and as disclosed in "p-channel Charge Coupled Devices with Resistive Gate Structures," Appl. Phys. Lets., USA, Vol. 20, No. 12, pp. 514–516, June 15, 1972.

It has been found, however, that interelectrode material is subject to field-modulated interelectrode conductance. In effect, a series of conductor-insulator-semiconductor (MIS) transistors is formed with the substrate acting as a gate and the electrodes acting as sources and drains. Field-modulated interelectrode conductance has been found for standard charge-coupled structures as well as for the buried-channel structures disclosed in U.S. Pat. No. 3,739,140, issued to R. H. Krambeck.

SUMMARY OF THE INVENTION

A charge-coupled device comprises a semiconductor substrate, a layer of insulation covering the substrate, a plurality of spaced-apart electrodes fabricated from doped polycrystalline semiconductor material having a particular conductivity type formed on the surface of the layer of insulation, and regions of interelectrode material located between each of the plurality of spaced-apart electrodes and having a conductivity type opposite to said particular conductivity type.

DESCRIPTION OF THE DRAWINGS

For a more complete understanding of the charge-coupled device structure of the present invention, reference may be had to the accompanying drawings which are incorporated herein by reference and in which.

DESCRIPTION OF THE PREFERRED EMBODIMENTS

Figure 2:
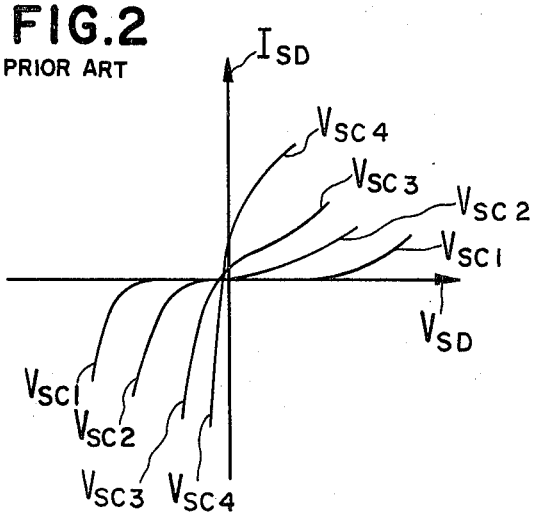
FIG. 2 is a qualitative graph depicting the relationship between voltage in the buried channel and current and voltage across the undoped interelectrode regions of the prior art.

In FIG. 2, I is the current in the interelectrode material, V is the voltage difference between adjacent electrodes, and $V_B$ is the voltage in the substrate or buried layer. By reference to this Figure it can be seen that a leakage current I will flow between gate electrodes at low gate-to-gate voltages, V, whenever the potential difference, $V_B$, between the channel and lower-voltage gate (the source of the MIS transistor) exceeds the threshold level of the effective MIS transistor. This field-effect transistor phenomenon is the primary factor affecting the flow of leakage current at low gate-to-gate voltages since (1) leakage current is miniscule below the threshold and (2) the clocking voltages on the polycrystalline silicon gate electrodes can in general be held low enough to not induce space-charge-limited current flow.

Figure 1:
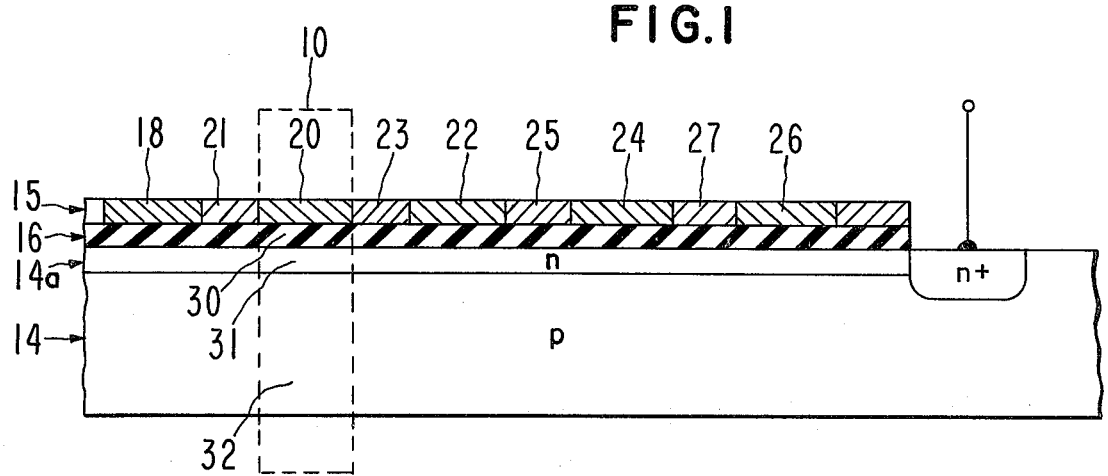
FIG. 1 is a cross-sectional view of a portion of a line of charge-coupled elements formed in a continuous semiconductor substrate with a buried-channel layer in the topmost portion thereof.
Figure 1A:
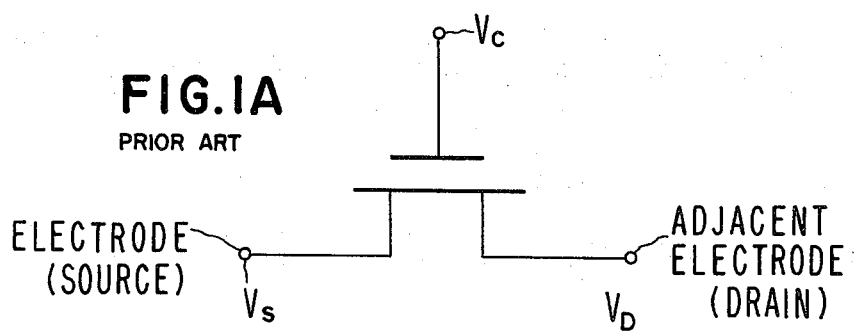
FIG. 1A is a schematic diagram of the spurious conductor-insulator-semiconductor structure of the prior art.

A typical charge-coupled device of the buried-channel type such as an area array or shift register will contain a multiplicity of charge-coupled elements such as the charge-coupled element described within the dotted line in FIG. 1. Each element will consist of a conductive gate electrode 20, the associated underlying insulator 30 and the associated underlying bulk substrate consisting, in this embodiment, of n-type layer 31 and p-type substrate 32. Packets of charge will be transferred along the line of charge-coupled elements in the well-known manner by varying the potential on the electrodes in alternating timed sequence. In the embodiment shown in FIG. 1, the elements 18, 20 . . . 26 and the regions of interelectrode material 21, 23 . . . 27 have been formed from a uniform planar layer of a polycrystalline semiconductor material such as polycrystalline silicon. Since a p-type substrate has been used, for bulk substrate 14, the buried-channel structure requires an n-type layer 14a to provide the appropriate conduction characteristics, i.e., to permit electrons to be conveyed along the buried channel. The insulator layer 16 will typically be fabricated from silicon dioxide. The conductive gate electrodes 18, 20 . . . 26 must be sufficiently doped (on the order of $10^{19}/cm^3$) to provide high conductivity. The regions of interelectrode material 21, 23 . . . 27 have been slightly doped with a p-type dopant such as boron so as to raise the threshold voltage of the effective conductor-insulator-semiconductor field-effect transistors. It should be noted that a pair of reverse-biased diodes is also created but this model is not particularly useful because the operating parameters of charge-coupled devices would not be such as to approach a condition for resistive current flow due to the high sheet resistivity of the regions of interelectrode material.

The relationship between the current I in the regions of interelectrode material and the voltage difference V between adjacent electrodes is shown in the family of constant $V_B$ curves shown in FIG. 2 for undoped polycrystalline silicon having a bulk resistivity of $2 \times 10^6$ ohm cm. It is clear that for a given $V_B$, the current increases with an increase in voltage difference V between adjacent electrodes; the rate of increase increases as $V_B$ is raised. Essentially, however, a family of constant $V_B$ curves exists with significant currents even for low values of V. It has been found that a slight doping of the regions of interelectrode material with an impurity of conductivity type opposite to the conductivity type of the electrodes causes the family of curves to be discontinuous, i.e., will allow current to flow only if the threshold of the effective conductor-insulator-semiconductor is exceeded.

EXAMPLE 1

Figure 3:
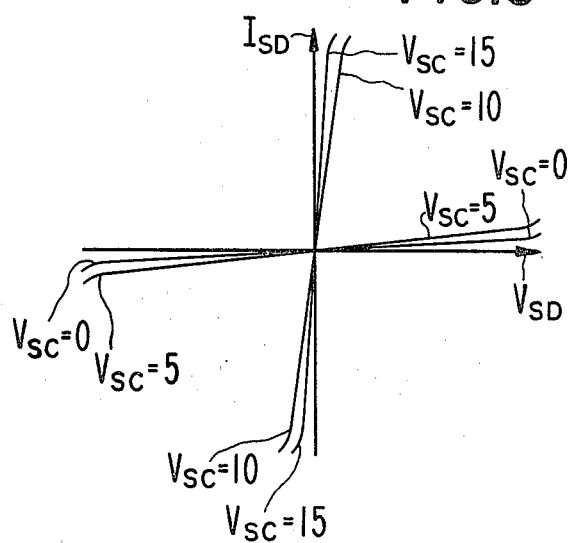
FIG. 3 is a graph depicting the relationship between voltage in the buried channel and the current and voltage across the slightly doped interelectrode regions of the present invention.

In a charge-coupled device having a p-type substrate and an n-type buried-channel layer, the regions of interelectrode material between n-type conductive polycrystalline silicon electrodes were doped with boron with a concentration of $5 \times 10^{13}/cm^3$. The buried-channel region was maintained at voltages of 0v, +5v, +10v and +15v. At 0v and 5v no appreciable leakage current (less than $10\mu$) between electrodes existed for an interelectrode voltage difference of +14v. At $V_B = 10v$ a leakage current of $120\mu A$ was measured for an interelectrode voltage difference of 2v. At $V_B - 15v$ a leakage current of $120\mu A$ was measured for an interelectrode difference of about 0.5v. This discontinuity in the family of constant $V_B$ curves is shown in FIG. 3.

EXAMPLE 2

In a charge-coupled device having a p-type substrate and an n-type buried-channel layer, the regions of interelectrode material between n-type conductive polycrystalline silicon electrodes were doped with boron having a concentration of $1 \times 10^{15}/cm^3$. The buried-channel region was maintained at voltages of 0v, +5v, +10v and +15v. At $V_B = 0v$ and 5v no appreciable leakage current (less than $10\mu A$) between electrodes existed for an interelectrode voltage difference of 15 volts. At $V_B = 10v$ a leakage current of $40\mu A$ was measured at V = 2 volts, $62\mu A$ at V = 4 volts, $76\mu A$ at V = 6 volts, $88\mu A$ at V = 8 volts, $95\mu A$ at V = 10 volts, $106\mu A$ at V = 12 volts and $116\mu A$ at V = 14 volts. At $V_B = 15$ volts the leakage current was $120\mu A$ for $V_B$ less than 1 volt.

EXAMPLE 3

In a charge-coupled device having a p-type substrate and an n-type buried-channel layer, the regions of interelectrode material between n-type conductive polycrystalline silicon electrodes were doped with boron having a concentration of $5 \times 10^{16}/cm^3$. The buried-channel region was maintained at potentials of 0, +5v, +10v and +15v. At 0v and +5v no appreciable leakage current (less than $10\mu A$) between electrodes for an interelectrode difference of 15 volts. At $V_B = 10$ volts a leakage current of $12\mu A$ was measured at V = 2 volts, $18\mu A$ at V = 4 volts, $24\mu A$ at V = 6 volts, $27\mu A$ at V = 8 volts, $29\mu A$ at V = 10 volts, $32\mu A$ at V = 12 volts, and $34\mu A$ at V = 14 volts. At $V_B = +15$ volts, the leakage current was $120\mu A$ for V equal to about one volt.

For charge-coupled devices of the type described above in Examples 1–3, it was found that boron doping of the regions of interelectrode material at concentrations on the order of $5 \times 10^{17}/cm^3$ and greater produced a continuation of the trend towards higher MIS threshold voltages $V_B$. However, for adjacent electrode voltages V greater than two volts, the so-called 'soft breakdown effect' intervened and the region of interelectrode material was conductive for virtually any finite substrate voltage $V_B$. Thus, for practical charge-coupled devices, the effective range of boron doping to counteract the field-modulated conductance effect is $10^{13}$ to $10^{17}$ atoms/cm$^3$. A preferred range would be $10^{15}$ to $10^{16}$ atoms/cm$^3$ since this would permit substrate voltages of up to 10 volts to exist with limited conduction through the regions of interelectrode material.

What is claimed is:

1. In a charge-coupled device having a semiconductor substrate, a layer of insulation covering said substrate, a plurality of spaced-apart electrodes formed from a doped polycrystalline semiconductor material on said layer of insulation and having a particular conductivity type, and regions of polycrystalline semiconductor interelectrode material located between said plurality of spaced-apart electrodes, and means connected to said electrodes for forming a spatially defined depletion region in said substrate beneath said electrodes and for transferring charge from one location to another in said depletion region, the improvement comprising:

said polycrystalline semiconductor interelectrode material contains a dopant which gives to said polycrystalline semiconductor interelectrode material a conductivity type opposite to said particular conductivity type.

2. A charge-coupled device as recited in claim 1, further comprising a buried-channel layer formed in the topmost surface of said semiconductor substrate, said buried-channel layer having said particular conductivity-type and said substrate having said conductivity type opposite to said particular conductivity type.

3. A charge-coupled device as recited in claim 1 wherein said plurality of spaced-apart electrodes are of n-conductivity type and said polycrystalline semiconductor interelectrode material is of p-conductivity type.

4. A charge-coupled device as recited in claim 3 wherein the concentration of said dopant lies within the range of $10^{13}$ to $10^{17}$ atoms/cm$^3$.

5. A charge-coupled device as recited in claim 3 wherein the concentration of said dopant lies within the range of $10^{15}$ to $10^{16}$ atoms/cm$^3$.

6. A charge-coupled device as recited in claim 5 wherein said dopant is boron.

* * * * *